(12) United States Patent
Burggraf et al.

(10) Patent No.: US 9,984,942 B2
(45) Date of Patent: May 29, 2018

(54) METHOD AND DEVICE FOR LEVELING A SUBSTRATE STACK

(71) Applicant: EV Group E. Thallner GmbH, St. Florian am Inn (AT)

(72) Inventors: Jurgen Burggraf, Scharding (AT); Friedrich Paul Lindner, Scharding (AT)

(73) Assignee: EV Group E. Thallner GmbH, St. Florian am Inn (AT)

( * ) Notice: Subject to any disclaimer, the term of this patent is extended or adjusted under 35 U.S.C. 154(b) by 0 days. days.

(21) Appl. No.: 15/300,488

(22) PCT Filed: Mar. 31, 2015

(86) PCT No.: PCT/EP2015/057054
§ 371 (c)(1),
(2) Date: Sep. 29, 2016

(87) PCT Pub. No.: WO2015/165679
PCT Pub. Date: Nov. 5, 2015

(65) Prior Publication Data
US 2017/0110377 A1 Apr. 20, 2017

(30) Foreign Application Priority Data
Apr. 30, 2014 (DE) .................. 10 2014 106 100

(51) Int. Cl.
*H01L 21/00* (2006.01)
*H01L 21/66* (2006.01)
(Continued)

(52) U.S. Cl.
CPC ........ *H01L 22/12* (2013.01); *H01L 21/67092* (2013.01); *H01L 21/6835* (2013.01);
(Continued)

(58) Field of Classification Search
CPC ............... H01L 21/67092; H01L 22/12; H01L 41/312–41/313; H01L 24/26–24/33;
(Continued)

(56) References Cited

U.S. PATENT DOCUMENTS 5,733,182 A * 3/1998 Muramatsu ........... B24B 41/068
451/285
8,852,391 B2 10/2014 McCutcheon et al. ....... 156/714
(Continued)

FOREIGN PATENT DOCUMENTS

DE 100 52 293 A1 4/2002 ............. H01L 21/00
DE 10 2009 015 878 A1 10/2010 ............... B24B 7/17
(Continued)

OTHER PUBLICATIONS

Schmitz et al., "Silicon Wafer Thickness Variation Measurements using Infrared Interefometry," 2003, American Society for Precision Engineering, Winter 2003 Topical Meeting, vol. 28, pp. 98-103.*
(Continued)

*Primary Examiner* — Selim Ahmed
*Assistant Examiner* — Evan Clinton
(74) *Attorney, Agent, or Firm* — Kusner & Jaffe

(57) ABSTRACT

A method for equalizing the thickness variation of a substrate stack which is comprised of a product substrate and a carrier substrate and which is connected in particular by means of an interconnect layer, by local application of local thickness peaks by means of an application apparatus which has at least one application unit. Furthermore this invention relates to a corresponding device.

19 Claims, 5 Drawing Sheets

(51) Int. Cl.
*H01L 21/67* (2006.01)
*H01L 21/683* (2006.01)

(52) U.S. Cl.
CPC ...... *H01L 22/20* (2013.01); *H01L 2221/6834* (2013.01); *H01L 2221/68327* (2013.01)

(58) Field of Classification Search
CPC ..................................... H01L 51/0024; H01L 2221/68304–2221/68395
See application file for complete search history.

(56) References Cited

U.S. PATENT DOCUMENTS

| | | | | |
|---|---|---|---|---|
| 2002/0062921 | A1 | 5/2002 | Muffler | 156/286 |
| 2006/0215175 | A1* | 9/2006 | Yacoubian | G01N 21/1717 356/502 |
| 2010/0112782 | A1 | 5/2010 | Teixeira | 438/458 |
| 2011/0308739 | A1 | 12/2011 | McCutcheon et al. | 156/766 |
| 2012/0024456 | A1 | 2/2012 | Lin et al. | 156/64 |
| 2012/0052771 | A1 | 3/2012 | Runkel | 451/1 |
| 2015/0340264 | A1* | 11/2015 | Siegert | H01L 21/6835 438/667 |

FOREIGN PATENT DOCUMENTS

| | | | | |
|---|---|---|---|---|
| DE | 10 2010 027 703 A1 | 12/2011 | ............. | H01L 21/30 |
| EP | 0 511 777 A1 | 4/1992 | ............. | H01L 21/321 |

OTHER PUBLICATIONS

International Search Report from corresponding International Patent Application No. PCT/EP2015/057054, dated Jun. 22, 2015.
Niklaus et al., "Adhesive wafer bonding," Applied Physics Reviews—Focused Review, Journal of Applied Physics 99, pp. 031101-1 through 031101-28 (2006).

* cited by examiner

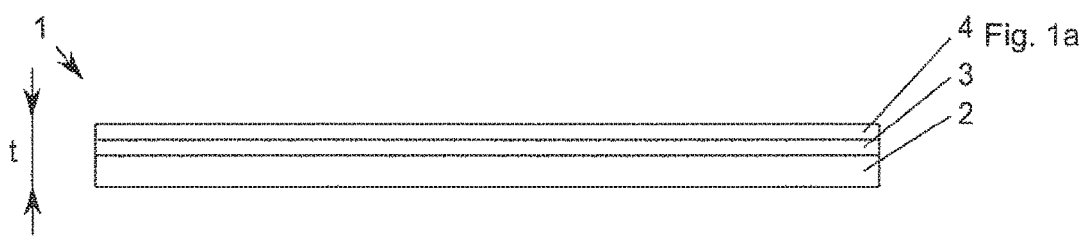
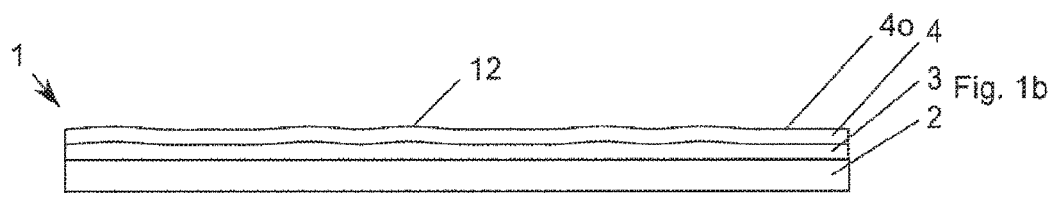
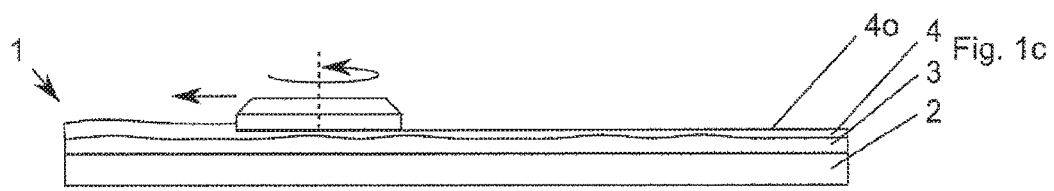

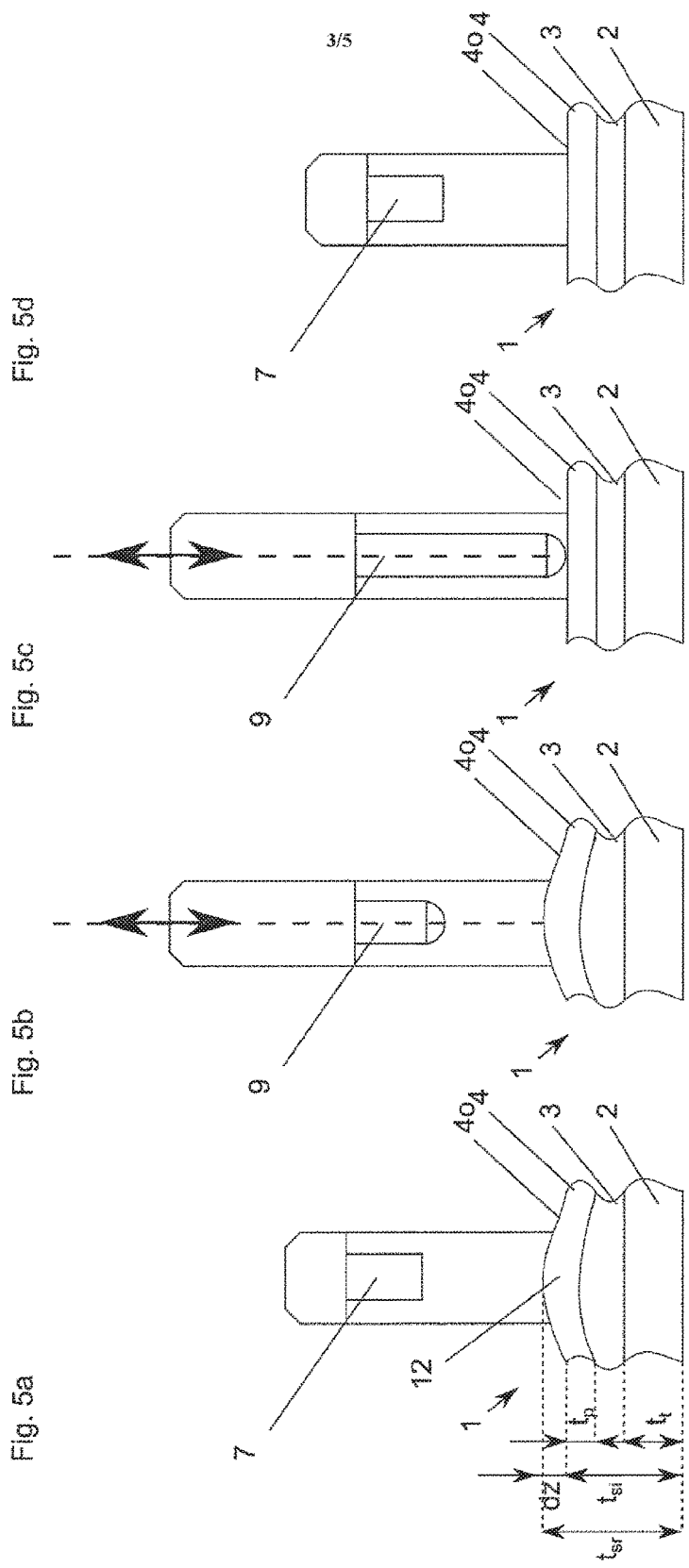

METHOD AND DEVICE FOR LEVELING A SUBSTRATE STACK

FIELD OF INVENTION

This invention relates to a method for equalizing the thickness variation in a post-bond process of a wafer stack and a corresponding device.

BACKGROUND OF THE INVENTION

In the modern semiconductor industry the reduction of the layer thickness of a substrate is an essential prerequisite for the continuously advancing miniaturization of the semiconductor components. A few years ago, active and passive components were produced only on a single substrate, especially a wafer. Today, substrates of different functionality are aligned to one another and bonded to one another. Contact is made between the individual function units, preferably through silicon vias (TSVs). The TSVs allow direct production of an electrically conductive connection between the substrates.

One of the critical processes in the production of such a multisubstrate stack is the back-thinning process. In a back-thinning process a substrate with a diameter of generally several hundred millimeters is thinned to a layer thickness of down to less than 50 µm. The substrate is therefore mechanically stabilized during the back-thinning process using a carrier substrate. Moreover the stabilization technology is also intended to allow further processing, transport, and storage of the few micron-thick substrate.

The most frequently used carrier technology is so-called temporary bonding. In temporary bonding a temporary cement is applied to the product wafer (which is to be back-thinned) and/or the carrier substrate. Afterwards a temporary bonding process between the product substrate and the carrier substrate takes place. Here, it is often such that the product substrate side, which is fixed with the temporary cement on the carrier wafer, already has functional units. The functional units can be microchips, LEDs, MEMs, RDLs, or bumps. The layer thickness of the temporary cement must be accordingly greater than the maximum height of the functional units in order to ensure complete embedding of the functional units in the cement.

A very serious problem in the prior art is the so-called total thickness variation (TTV). This is defined as the difference between the maximum and minimum thickness of an object along one given direction or one plane. For example, the TTV of a silicon wafer is defined as the difference between the maximum thickness which is to be found at one location of the silicon wafer and its minimum thickness which is to be found elsewhere.

The concept of the TTV can also be expanded to combined objects. Thus, in the semiconductor industry the thickness variation of a bonded substrate stack is generally measured. In doing so the substrate stack with the surface of its first substrate pointing to the outside is deposited on a plane of a measuring device which is as planar as possible. Afterwards a relative movement of the substrate stack with respect to a sensor takes place. The sensor is generally a laser interferometer. With one laser interferometer thickness changes into the nanometer range can be detected and ascertained. A measurement of the substrate stack thickness along the measurement direction takes place by the relative movement between the bonded substrate stack and the laser interferometer. Layer thickness maps and the maximum and minimum layer thickness, and thus the TTV, can be determined from the profile which has been obtained in this way.

The knowledge of the TTV is important mainly for those processes which are applied to the product substrate after bonding, mainly back-thinning and etching processes. An overly large TTV provides specifically for nonuniform thickness removal and thus leads to destruction of the product substrate in the worst case.

SUMMARY OF THE INVENTION

The object of the invention is to devise a process and a device with which the thickness variation can be reduced, and therefore improved.

This object is achieved with the features of the independent claim(s). Advantageous developments of the invention are given in the dependent claims. All combinations of at least two of the features given in the specification, the claims and/or the figures also fall within the scope of the invention. At the given value ranges, values within the indicated limits will also be considered to be disclosed as boundary values and will be claimed in any combination. To the extent features disclosed for the device can also be construed as method features, they are also to apply according to the method and vice versa.

The basic idea of this invention is to equalize the thickness variation of a substrate stack which is connected by means of an interconnect layer, of a first substrate, in particular a carrier substrate, and a second substrate, in particular a product substrate, by local application on local thickness extremes, especially thickness peaks, by means of an application apparatus which has at least one application unit. A thickness extreme can be either a thickness peak or a thickness valley. Hereinafter in this patent the application of thickness peaks which is preferred is used by way of example, but not exclusively, to describe the embodiments of the invention.

A product substrate which is made in particular as a product wafer is thinner than the carrier substrate which is made in particular as a carrier wafer and which is intended for support of the product substrate.

Equalizing within the scope of this invention means in particular that the thickness variation of a bonded substrate stack is reduced by the execution of the method of the invention by 25%, preferably by 50%, still more preferably by at least 75%, most preferably by at least 90%, most preferably of all by at least 95%, The invention relates especially to a method and a system for reducing the total thickness variation of a bonded substrate stack. One aspect of the invention lies in particular in a measuring device for determining the TTV or the X-Y position of local peaks, especially in combination with a device which can apply preferably locally on the substrate stack, especially the boundary surface between the two substrates or an interconnect layer between the substrates in order to change thickness fluctuations in a controlled manner, in particular to equalize them. The method of the invention is preferably carried out as a post-bond process. The method of the invention and the system of the invention are preferably used to reduce the TTV between two substrates and a layer in between, in particular a layer of cement. Alternatively the device and the method can also be used to directly manipulate the TTV of a layer, in particular a layer of cement. In particular therefore all the indicated embodiments and processes of the invention with respect to the direct manipulation of a layer, in particular a layer of cement, are likewise considered to be disclosed. The invention relates in particular a method and a system for reducing, in particular for completely eliminating the in particular total thickness variation of a substrate stack. The substrate stack is preferably a substrate stack which has been produced by a temporary bonding process. The method of the invention can also be fundamentally used for local compensation of unevenness, and thus of the TTV on permanently bonded substrate stacks and/or substrate stacks which have been produced by a prebond.

The fundamental advantage of the embodiment of the invention and of the system of the invention is the possibility of a post-bond reduction of the TTV. In terms of process technology the effort will always be made to reduce the TTV completely during bonding. But experience shows that even with the most efficient and most modern bonding systems, a complete reduction of the TTV is not possible.

The system of the invention is comprised in particular of at least two units, specifically:
- at least one measurement unit for measuring the thickness distribution or X-Y position of the thickness peaks and
- an application apparatus for controlled change, especially equalizing of convex bows of the substrate stack or of thickness peaks of the substrate stack, especially of the interconnect layer.

Measuring Unit

The first unit is a measuring unit for measuring the local thicknesses along one surface of a substrate stack, especially along one surface of the product substrate. The in particular total thickness variation and/or X-Y position of thickness peaks and/or thickness valleys can be determined from the measurement of the thickness at different X-Y positions along one of the aforementioned surfaces. The X-Y positions are preferably filed in a central control unit for controlling all method steps and components of the device.

The measuring unit is comprised in particular of a transmitter and a receiver. Preferably the transmitter and receiver are mechanically coupled to one another. In one still more preferred embodiment the transmitter and the receiver are installed jointly in one unit, in particular in a preferably closed housing. Hereinafter, in simplified terms a transmitter is addressed. It means a component which emits signals, for example electromagnetic waves or acoustic sound waves, receives, evaluates and analyzes them in order to determine the aforementioned thicknesses as values which can be further used for the equalizing.

In a first embodiment of the measuring unit it is an optical measuring unit, in particular with an optical transmitter. The optical measuring unit preferably has an interferometer. The interferometer can be a monochromatic, or according to one preferred embodiment, a polychromatic white light interferometer. In one special embodiment the interferometer is an infrared interferometer.

In a second embodiment the measuring unit is made as an acoustic measuring unit, in particular with an acoustic sensor. The acoustic measuring unit preferably has one ultrasonic transmitter. To inject the ultrasonic signal into the substrate stack, preferably a fluid, especially a liquid is applied between the transmitter and the surface of the substrate stack. Therefore this type of measurement is not preferred.

The transmitter is preferably mounted rigidly or statically with reference to the mounting base. The mounting base is as level as possible and is used to accommodate a wafer chuck which can move preferably along the mounting base and on which the substrate stack can be fixed, and is fixed for measuring and/or equalizing. The movable wafer chuck enables relative movement between the substrate stack and the transmitter and thus a measurement of the layer thickness of the substrate stack along the aforementioned surfaces.

Subsequently the evenness is used as a measure of the perfection of a planar area, in particular a surface. Deviations from a planar surface result from ripples and roughness. The ripple of a surface is characterized by a certain periodic raising and lowering of the surface, in particular in the millimeter range, less often in the micron range. Conversely, roughness is a rather aperiodic phenomenon in the micron or nanometer range. The exact definition of these surface properties is known to one skilled in the art of surface physics, tribology, mechanical engineering or materials science. In order to treat the different deviations from the ideal surface, hereinafter the concept of roughness is used synonymously for the aforementioned effects and the superposition of all these effects. The roughness is specified either as the average roughness, quadratic roughness or as the averaged peak-to-valley height. The determined values for the average roughness, the quadratic roughness and the averaged peak-to-valley height generally differ for the same measured distance or measurement area, but are generally of the same order of magnitude. Therefore the following ranges of numerical values for the roughness should be understood either as values for the average roughness, the quadratic roughness or for the averaged peak-to-valley height.

The roughness of the mounting base is as small as possible, in particular less than 100 μm, preferably less than 10 μm, more preferably less than 1 μm, most preferably less than 100 nm, most preferably of all less than 10 nm, still more preferably less than 1 nm. The mounting base is comprised preferably of a mechanically rigid material with low plastic deformability, especially granite. The modulus of elasticity of the mounting base is especially greater than 0.01 GPa, preferably greater than 0.1 GPa, still more preferably greater than 1 GPa, most preferably greater than 100 GPa, most preferably of all greater than 1000 GPa. The high surface evenness and thus low roughness are achieved in particular by grinding, polishing and etching methods.

The wafer chuck moves preferably on air-cushion bearings along the mounting base. The surface of the wafer chuck preferably has a correspondingly low roughness. The roughness of the wafer chuck surface is in particular less than 100 μm, preferably less than 10 μm, more preferably less than 1 μm, most preferably less than 100 nm, most preferably of all less than 10 nm, still more preferably less than 1 nm. The modulus of elasticity of the wafer chuck is especially greater than 0.01 GPa, preferably greater than 0.1 GPa, still more preferably greater than 1 GPa, most preferably greater than 100 GPa, most preferably of all greater than 1000 GPa.

In one especially preferred embodiment the position-dependent thicknesses are determined in a two-step process. In the first step the thicknesses of the substrate stack are determined by relative movement between the substrate stack and the transmitter, including their X-Y positions. Afterwards a 180° rotation of the substrate stack around its surface normal and repeated measurement of the substrate stack take place. The actual thickness distribution of the substrate stack can then be computed from the arithmetic mean of the two thickness distributions before and after the rotation. The prerequisite for this averaging process is the unambiguous assignment of the substrate stack points and X-Y positions between the two coordinate systems which are turned to one another. The advantage of this embodiment is mainly that unevenness of the wafer chuck and/or of the mounting plate has less effect on the averaged end result by statistical averaging of the measured layer thicknesses. If repeated measurement of each point were carried out without the rotation, only better counting statistics would be obtained.

Application Apparatus

The second unit or device, which is in particular independent, is an application apparatus by which the substrate stack is exposed to local influences, in particular deformations, to the extent one is necessary for reducing the TTV of the substrate stack. The influences can be mechanical, electrical, magnetic and/or thermal influences. Mechanical and/or thermal influences are preferred.

The thickness distribution of the substrate stack which was prepared beforehand and which was filed in the especially software-controlled control apparatus is now used to recognize local extremes (therefore peaks and/or valleys). These extremes occur in particular in substrate stacks which have been produced by a temporary bond. At least predominantly the substrate stack points to locally different thicknesses due to nonuniformity of the thickness of the temporary cement or of the interconnect layer. Furthermore the thickness, especially in isolation or subordinated, is influenced by the topography of the product substrate, by inclusions, particles or thermal loading.

One aspect of the invention includes using the application apparatus to reduce local extremes in a controlled manner. In particular the application apparatus is designed to be rigid analogously to the measuring unit, is manufactured accordingly exactly, can be loaded, and delivers reproducible results. In special embodiments the application apparatus is combined with a measuring unit, especially located and fixed on the same mounting base. Thus, a compact embodiment of the system is devised. Furthermore, the transport path of the substrate stack between the measuring unit and the application apparatus is minimal. Another advantage of the combination of the measuring unit and the application apparatus is the parallel execution of the measurement and local change of the thicknesses.

It would in particular be conceivable for the transmitter of the measuring unit to be located at a first position and an application unit of the application apparatus to be located at a second position. To the extent the substrate stack is moved over the mounting base such that the X-Y position of a local peak of the substrate stack first passes the position of the transmitter of the measuring unit and afterwards the position of the application unit, at a first position a thickness measurement can be taken and at a second position simultaneously the change of the layer thickness can be carried out. Thus a correspondingly higher throughput is achieved.

In an entirely special embodiment the measuring unit and the application apparatus are located separately from one another, preferably in different modules of the same plant (fab) or even in modules of different fabs. In this way the measurement of the thickness distribution is separated from the equalizing of the substrate stack and it becomes possible to combine measuring units and application apparatus of different manufacturers with one another.

The application apparatus can be made as a spot application apparatus or as a surface application apparatus. The surface application apparatus is the embodiment which is preferred, since the throughput is distinctly higher for the equalizing. It is comprised in particular of a field of spot application apparatus, and each of the spot application apparatus can be in particular triggered and monitored separately. The manner of operation of the method and of the device of the invention becomes in particular clear and simple by the description of the manner of operation of a spot application apparatus.

Spot Application Apparatus

In a first embodiment, the application apparatus has exactly one application unit which is able to apply in particular mechanical pressure to the surface of the substrate stack, especially to the surface of the product substrate. The application unit is preferably stamped to be pin-shaped. Preferably the compressive stress on the convex bow of a local peak causes flow of the interconnect layer between the carrier substrate and the product substrate and thus a level of the thickness of the interconnect layer and thus of the substrate stack. The tip of the pin can have different shapes. Thus, pointed shapes, rounded, especially spherical, or rectangular shapes are conceivable.

In one embodiment, the application unit can be heated. The temperature of the application unit can be regulated in particular with a precision better than 5° C., preferably better than 2° C., still more preferably better than 1° C., most preferably better than 0.1° C., most preferably of all better than 0.01° C. The triggerable temperature range of the application unit is especially between room temperature and 100° C., preferably between room temperature and 300° C., still more preferably between room temperature and 500° C., most preferably between room temperature and 700° C. The heatable application unit can either make contact with the surface of the substrate stack and deliver heat via heat conduction, or can be stopped at a certain distance from the surface of the substrate stack and can heat the more immediate vicinity by heat radiation and/or thermal convection. The delivery of heat leads mainly to a (locally limited) heating and thus a change of the viscosity, especially a decrease of viscosity, of the temporary cement and thus preferably to a decrease of convex bows by relaxation, especially due to the internal stress of the product substrate and/or carrier substrate.

In a third embodiment, the application unit has a laser which can be in particular focused as exactly as possible. The coherent laser light is concentrated by optics preferably at a focus which is located between the product substrate and the carrier substrate, therefore in the interconnect layer. In this way heating of the interconnect layer as locally limited, intense and rapid as possible is effected. The laser is preferably pulsed, in particular by continuous, preferably high-frequency turning on and off. This pulsing for the most part completely prevents heating of the vicinity. The laser is in particular an infrared laser, a laser for visible light or a laser for UV light. The wavelength of the laser is preferably between $10^{-8}$ and $10^{-3}$ m, preferably between $10^{-8}$ and $10^{-4}$ m, most preferably between $10^{-8}$ and $10^{-5}$ m. Lasers in the wavelength ranges which can cause a chemical reaction in the interconnect layer are especially preferable. This chemical reaction leads in particular to breakdown of a covalent bond. The energy which is necessary for breakdown of a chemical bond is preferably in the UV wavelength range. This chemical reaction can possibly influence the viscosity behavior of the interconnect layer and thus can further optimize the reduction of the TTV.

In one especially preferred embodiment, the application unit combines a heating unit and/or pressure unit and/or laser unit so that thermal and/or mechanical and/or photo-chemical stresses are possible at the same time.

Other embodiments, which however are not preferred, call for switching the application unit as a field electrode so that an electrical field of high intensity can be generated at a tip which is as pointed as possible. In doing so the wafer chuck is set in particular to a potential which is accordingly charged oppositely. The interconnect layer can be physically and/or chemically influenced by the generation of correspondingly high electrical fields.

In another embodiment, it is conceivable to build the application unit as a magnetic pole shoe so that a magnetic field as strong as possible can be generated. This field penetrates the substrate stack and causes changes in the interconnect layer which allow equalizing.

The spot application apparatus and/or the wafer chuck are controlled via corresponding software and/or firmware and/or hardware such that the convex bulges or thickness peaks which are to be applied upon are approached individually and are planarized as extensively as possible by the loading of the application unit on the surface. This minimizes the TTV of the substrate stack.

The application unit according to one preferred embodiment of the invention in any embodiment can be moved at least along the Z axis.

Surface Application Apparatus

Surface application apparatus is comprised of several application units which can be triggered in particular separately and/or which are arranged discretely. Each individual application unit, as described above, can be operated therefore mechanically and/or thermally and/or electrically and/or magnetically in order to influence the convex bows or thickness peaks of the substrate stack and thus to minimize the TTV. In contrast to the spot application apparatus, surface application apparatus can control several application units at the same time and thus can treat several locations, in particular several convex bows, at the same time. This leads to a considerable acceleration, especially by a factor corresponding to the number of application units provided.

The following embodiments are devices which are comprised of several application units. The application units are arranged next to one another, in particular flush in a rest position. The arrangement of the application units is preferably regular, in particular the arrangement takes place along a rectangular grid. An arrangement of the application units in several circles concentric to one another with a radius which increases accordingly would also be conceivable. Another possibility which is conceivable would be an arrangement of the application units along a hexagonal or surface-centered grid.

According to a first embodiment of the surface application apparatus, the application units apply directly on the surface of the product substrate. The application units can mechanically and/or thermally and/or electrically and/or magnetically change the surface of the product substrate. Analogous considerations as in the above described spot application apparatus apply to the different versions of influence. Accordingly the application units can in turn have built-in heaters and/or apparatus for producing strong electrical and/or magnetic fields. The use of static application units or those which do not apply a mechanical load and which do not change their position or in any case change it to adjust a distance to the surface of the product substrate, therefore always have a distance greater than zero to the surface of the substrate stack, would also be conceivable. The convex bows in this embodiment are influenced largely, in particular exclusively, by heating elements. This surface application apparatus would be limited in particular to locally adjustable heaters which compared to the above described embodiment would not lead to optimum results.

In a second embodiment a membrane which is flexible and stretchable in the application direction of the application units is stretched in front of the application units. The membrane is at least locally deformed by the application units into one application position. The membrane, in contrast to the discrete application units, has a continuous surface, especially one which covers one entire application side of the surface application apparatus. This embodiment leads to an improved planely loading of the surface of the product substrate/substrate stack.

The membrane can fundamentally be comprised of any material, but is preferably wear-resistant, temperature-resistant, elastic and/or has correspondingly high strength.

For hardness there are different technological characteristics. The correct hardness measurement method depends on many influencing factors. The most important factors are the material which is to be tested as well as the test body. Metals and ceramics, therefore solids with correspondingly high strength and/or the corresponding capacity for plasticity, are primarily but not exclusively tested with Rockwell, Brinell and Vickers hardness methods. The conversion of the individual hardness measurement values is conditionally possible. Corresponding tables and formats exist and are known to one skilled in the art. But it must be mentioned that exact conversion is not always possible or is inexact. The following hardness measurement values relate to Vickers hardness. The Vickers hardness of the membrane material is in particular greater than 100, preferably greater than 500, still more preferably greater than 1000, most preferably greater than 5000, most preferably of all greater than 10000. In particular embodiments, membrane materials can also be preferably used which have a very low hardness and therefore can be especially well adapted to the surface of the substrate. These especially preferred membrane materials are comprised mainly of plastics, especially of plastics which are temperature-stable up to several hundred degrees Celsius. The preferred hardness measurement method for plastic is the Shore method. The Shore hardness of plastics is in particular less than 100, preferably less than 75, still more preferably less than 50, most preferably less than 25, most preferably of all less than 5. The exact definition can be looked up in the corresponding standards DIN ISO 7619-1 and DIN EN ISO 868.

In this connection temperature resistance means that the membrane at elevated temperature does not begin to creep, therefore that no plastic deformation by diffusion processes arises under load. In order to avoid having to address the more detailed physical and chemical processes of creep, a creep-resistant material is characterized in that the corresponding material does not experience plastic deformation as a function of time up to a maximum tension and a maximum temperature. The maximum temperature is in particular greater than 0° C., preferably greater than 50° C., still more preferably greater than 100° C., most preferably greater than 250° C., most preferably of all greater than 500° C. The maximum tension is in particular greater than 10E6 Pa, preferably greater than 10E7 Pa, more preferably greater than 10E8 Pa, most preferably greater than 10E9 Pa.

The elasticity is described by the modulus of elasticity. The modulus of elasticity of the membrane is especially between 1 GPa and 1000 GPa, preferably between 10 GPa and 1000 GPa, more preferably between 25 GPa and 1000 GPa, most preferably between 50 GPa and 1000 GPa, most preferably of all between 100 GPa and 1000 GPa. The modulus of elasticity of some types of steel is for example roughly 200 GPa.

The yield point specifies the maximum tension at which the body does not yet deform plastically. Materials for the membrane are preferred which have a high yield point in order to prevent permanent plastic deformation. The yield point of the membrane material is especially greater than 1 MPa, preferably greater than 10 MPa, still more preferably greater than 100 MPa, most preferably greater than 500 MPa, most preferably of all greater than 1000 MPa.

Membrane materials are especially preferred which do not contaminate the surface of the product substrate. The membrane materials should therefore preferably be free of all elements which are critical to semiconductor applications, especially metals like copper, gold, molybdenum and titanium. A membrane material is preferably used which is based on a polymer and/or carbon material.

In a third embodiment the application units are pressure chambers which are partitioned off from one another and which can be triggered and/or supplied especially separately with pressure. The pressure chambers are surrounded in the direction of the surface of the product substrate which is to be applied upon by a membrane and laterally by elastically deformable pressure chamber walls. The pressure chambers can preferably be exposed to overpressure and/or underpressure individually and allow deformation of the membrane and thus upon contact with the surface of the product substrate allow the application on the convex bows.

The pressure chambers have in particular a pressure between $10^{-8}$ mbar and 10 bar, preferably between $10^{-8}$ mbar and 8 bar, still more preferably between $10^{-8}$ mbar and 6 bar, most preferably between $10^{-8}$ mbar and 4 bar, most preferably of all between $10^{-8}$ mbar and 2 bar. The pressure chambers can be supplied with any fluid, therefore with liquids and/or gases. Accordingly they are hydraulic and/or pneumatic pressure chambers. Preferably liquids are not used, so that pneumatic pressure chambers are preferred.

The combination of a surface application apparatus with a measuring unit is conceivable, as described above. Preferably first the entire substrate stack (in particular with respect to its thickness and/or the thickness of individual layers of the substrate stack such as the thickness of the product substrate, carrier substrate and/or interconnect layer) is measured. Afterwards the improvement of the thickness variation (TTV) takes place in the surface application apparatus. In another optional step, the repeated measurement of the substrate stack then takes place. If the determined TTV should be smaller than a given boundary value, the substrate stack can be further processed. If it is greater, a repeated improvement of the thickness variation (TTV) takes place by means of the application apparatus.

In one preferred embodiment, the surface application apparatus and the measuring unit are located within one unit or within the same module, as a result of which the change between the measurement of the substrate stack and the improvement of the TTV is accelerated.

Arrangement and Shape of the Application Units

The shape of the application units, in particular on an application side and/or a jacket surface which is located on the end, can be fundamentally optional, to the extent in this way application on the surface is possible. It is shown however that certain shapes are suitable for special applications.

The jacket surfaces of the application units are preferably shaped as round, especially circular, or as square cylinders.

The application side (or application head) is shaped in particular to be rounded, to be flat, pointed, to be conically flattened, or to be hexagonally flat.

Flat application heads are better suited for reducing convex bows and for heat transfer.

Pointed application heads are mainly important when high electrical and/or magnetic fields are to be produced and localized.

Flat application heads with a hexagonal shape are in particular preferred since they are on the one hand flat, can completely cover one surface and due to their hexagonal symmetry have an optimum radial relation to their corresponding neighbors.

Other advantages, features and details of the invention will become apparent from the following description of preferred exemplary embodiments and using the drawings.

BRIEF DESCRIPTION OF DRAWINGS

FIG. 1a shows a schematic cross section of an ideal substrate stack without TTV, FIG. 1b shows a schematic cross section of a real substrate stack with thickness variation (TTV), FIG. 1c shows a schematic cross section of a treatment process (back-thinning) of a real substrate stack, FIG. 5a shows a schematic cross section of a first treatment step for one embodiment of a method of the invention, FIG. 5b shows a schematic cross section of a second treatment step for the embodiment according to FIG. 5a, FIG. 5c shows a schematic cross section of a third treatment step for the embodiment according to FIG. 5a, FIG. 5d shows a schematic cross section of an optional fourth treatment step for the embodiment according to FIG. 5a, FIG. 6a shows a schematic cross section of a surface application apparatus according to a first embodiment.

DETAILED DESCRIPTION OF THE INVENTION

Figure 2:
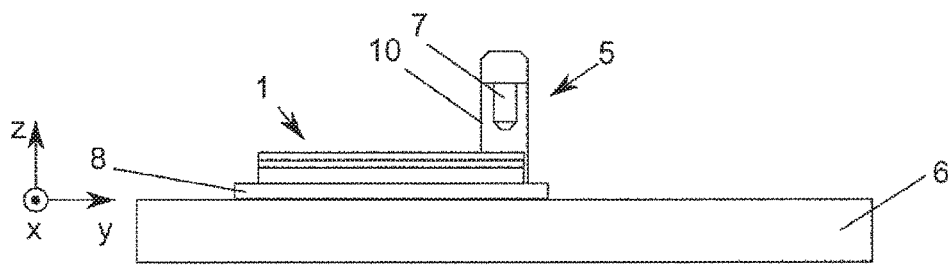
FIG. 2 shows a schematic cross section of one embodiment of a measuring unit.

In the figures the same components or components with the same action are identified with the same reference numbers.

FIG. 1a shows a schematic cross section of an ideal substrate stack 1, comprised of a carrier substrate 2, an interconnect layer 3 which is made as temporary cement, and a product substrate 4. In this embodiment, which cannot be technically implemented or which can be implemented with disproportionate effort, the carrier substrate 2, the interconnect layer 3 and the product substrate 4 have a uniform thickness, therefore a thickness variation (TTV) of zero. The uniform thicknesses of the carrier substrate 2, of the interconnect layer 3 and of the product substrate 4 thus lead to a uniform substrate stack thickness.

FIG. 1b shows a schematic cross section of a real substrate stack 1, comprised of a carrier substrate 2, an interconnect layer 3 with thickness variation, and a product substrate 4. The thickness variation is at least largely, essentially exclusively, dictated by the interconnect layer 3. The product substrate 4 is thinner than the carrier substrate 2, for which reason the product substrate 4 essentially follows the thickness variation of the interconnect layer 3, whereas the carrier substrate 2, at least when executing the method of the invention, is accommodated, in particular fixed, on a level wafer chuck 8.

The nonuniform substrate stack thickness t is clearly recognizable. The nonuniformity in the substrate stack thickness t during back-thinning (see FIG. 1c) of a surface 4o of the product substrate 4 leads to a corresponding nonuniform product substrate 4. Convexly curved sections of the surface 4o (local peaks) are more strongly removed, while concavely curved sections of the surface 4o (local valleys) are less removed. The entire product substrate 4 would be nonuniform after a stripping process although it had a uniform thickness beforehand.

This process can be solely prevented by its being ensured that the nonuniform thickness distribution and thus the TTV of the real substrate stack 1, which TTV is considered a dimension, are reduced by the embodiments of the invention to such an extent that an ideal substrate stack 1 is obtained. After the embodiment of the invention has converted a real substrate stack 1 into an ideal substrate stack 1, the latter can also be treated accordingly. An ideal substrate stack 1 is defined as a substrate stack 1 which has a TTV value below a fixed boundary value.

FIG. 2 shows a measuring unit 5 comprising a sensor 7, preferably an interferometer, even more preferably a white light interferometer. The sensor 7 is tightly connected to a solid mounting base via braces 10. The mounting base 6 is used as a mechanical vibration damper. On the mounting base 6 moreover the wafer chuck 8, preferably on an air-cushion bearing, is moved in an X-Y direction which is defined by the mounting base.

The wafer chuck 8 can fix the substrate stack 1 via various fixing elements (not shown). The fixing elements can be vacuum fixings, electrostatic fixings, mechanical clamps, adhesive surfaces, or similar fixing mechanisms. They are known to one skilled in the art.

The wafer chuck 8 can move in translation along the X and Y direction and can also preferably be moved along the Z direction (perpendicular to the X and Y direction) so that it enables raising of the substrate stack 1. In one especially preferred embodiment the wafer chuck 8 can be turned around a local Z axis and/or can be tilted around a local X and/or Y axis.

The first step is to measure the thickness distribution of the substrate stack 1, therefore exactly measure the layer thickness for each X-Y position of the substrate stack 1 by the measuring unit 5. The measuring unit is controlled by a control apparatus (not shown) and the measured values are filed for later use in the control of an application apparatus 11 (see FIGS. 3 to 9).

Figure 3:
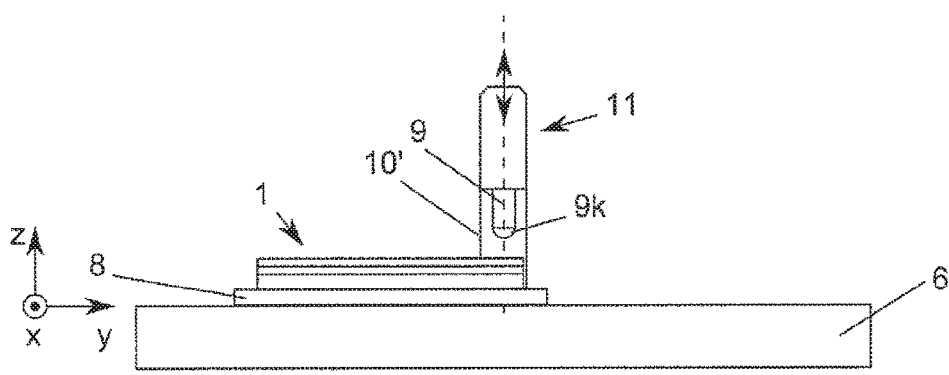
FIG. 3 shows a schematic cross section of one embodiment of a spot application apparatus.

FIG. 3 shows the application apparatus 11 made here as a spot application apparatus, comprising an application unit 9 which is connected to the mounting base 6 via braces 10'. The spot application apparatus 11 and the wafer chuck 8 are controlled by means of software and/or firmware and/or hardware (control apparatus). Convex bows or peaks 12 are approached individually (by moving the wafer chuck 8 and/or the application unit 9 in the X and Y direction) and are planarized as much as possible by the application of the application unit 9 on the surface 4o.

The application unit 9 is raised and lowered here along the Z direction (see arrows in FIG. 3) in order to equalize the substrate stack thickness t by the contact of an application head 9k with the surface 4o, especially by equalizing the convex bow 12.

The application unit 9 is preferably a pin. Accordingly the loading of the convex bow 12 is defined in particular as mechanical compressive loading. Preferably the mechanical compressive loading of the convex bow 12 produces flow and thus a more uniform distribution of the temporary cement 2 between the carrier substrate 2 and the product substrate 4.

Figure 4:
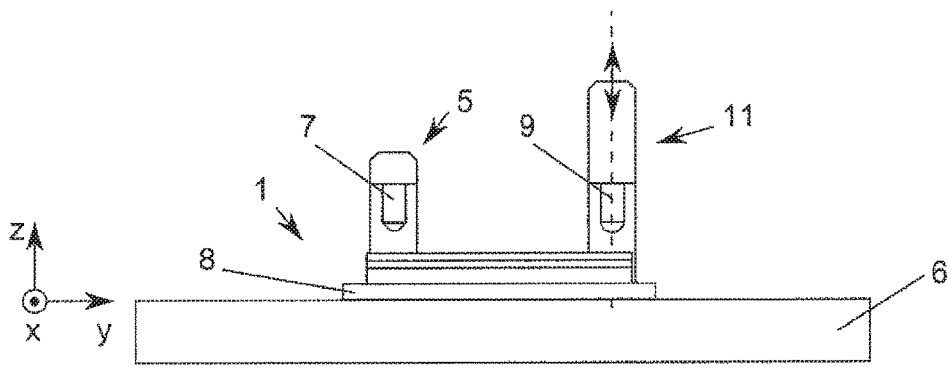
FIG. 4 shows a schematic cross section of one embodiment of a measuring unit and spot application apparatus which have been combined.

FIG. 4 shows one especially preferred embodiment in which the measuring unit 5 with the sensor 7 and the application apparatus 11 with the application unit 9 have been combined with one another in one unit or one module. In this way a correspondingly compact measurement and equalizing can be performed. Mainly the changing between measurement and equalizing can be carried as often as desired and above all correspondingly effectively and quickly.

FIG. 5a shows a schematic cross section of a first process step of the invention, in which a certain convex bow 12 is positioned under the sensor 7. The sensor 7 measures the real substrate stack thickness $t_{sr}$. When the carrier substrate thickness $t_t$ and the product substrate thickness $t_p$ are known, the convex bow 12 can be determined. The convex bow 12 is to be deformed as much as possible by a deformation path dz in the negative Z direction toward the carrier substrate 2 in order to achieve the desired ideal substrate stack thickness $t_{si}$ at this X-Y position.

FIG. 5b shows a schematic cross section of the positioning of the same convex bow 12 under the application unit 9. The positioning of the convex bow 12 should take place with high precision. The precision is in particular better than 1 mm (maximum deviation/tolerance in the X-Y direction), preferably better than 100 μm, more preferably better than 10 μm, most preferably better than 1 μm.

FIG. 5c shows a schematic cross section of the use of the application unit 9 by lowering and in this way after the application head 9k makes contact with the surface 4o by mechanical compressive application on the convex bow 12. In doing so the convex bow 12 is planarized. For better deformability of the interconnect layer 3 when applied upon, it is preferably heated, so that deformation as plastic as possible takes place.

FIG. 5d shows a schematic cross section of an optional fourth measurement step of repeated measurement of the same position in order to verify the decrease or even the disappearance of the convex bow 12 or optionally to apply an application again and/or to calibrate the application apparatus 11.

Under real conditions it can be shown that deformation of the convex bow 12 in the negative Z direction by the deformation path dz due to internal stresses of the substrate stack or flow behavior of the interconnect layer 3 is not always exactly possible so that the ideal parameters are determined by empirical measurements by means of the above described embodiment.

The process steps of the invention which are shown in FIGS. 5a-5d are carried out for all X-Y positions of the measured peaks of the substrate stack 1.

Figure 6A:
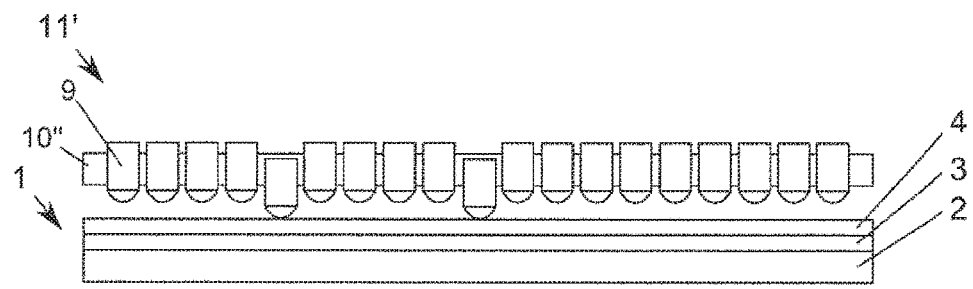
FIG. 6b shows a schematic cross section of a surface application apparatus according to a second embodiment.

FIG. 6a shows one preferred embodiment of an application apparatus 11' which is made as a surface application apparatus, comprised of several application units 9. The application units 9 are movably fixed on a brace body 10" in the Z direction which is in turn fixed on the mounting base 6.

The application units 9 can apply mechanically and/or thermally and/or electrically and/or magnetically on the surface 4o of the product substrate 4 or on the substrate stack 1 according to the embodiment as shown in FIG. 3 and thus can lead to a reduction of the convex bows 12.

The idea of the invention for the surface application apparatus includes, firstly, faster throughput and thus lower costs in the processing of several substrates and, secondly, in the possibility of carrying out a parallel deformation of the surface 4o of the product substrate 4 and of the underlying interconnect layer 3. This is necessary mainly when the removal of a convex bow 12 by an application unit 9 at one position leads to material flow and generation of a further convex bow 12. By dedicated and controlled simultaneous loading of several points of the surface 4o of the product substrate, the material flow in the temporary cement 3 can be better controlled and the thickness variation can be reduced even more efficiently.

The application units 9 can be triggered individually and can be moved in the Z direction from a rest position into an application position. In the rest position the application units 9 are located flush in one plane parallel to the X-Y direction. The application units 9 are preferably arranged equidistantly to one another and form a field of application units 9.

Figure 6B:
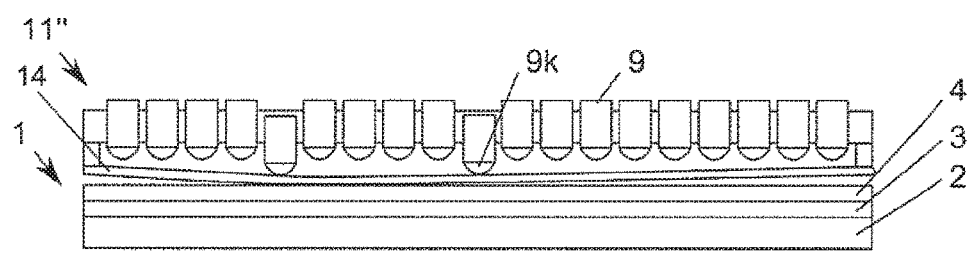

FIG. 6b shows an application apparatus 11" which constitutes an expansion of the embodiment according to FIG. 6a. Here the application apparatus 11" has a membrane 14. The membrane 14 is attached to the brace body 10" and overlaps the application heads 9k of the application units 9. The application units 9 deform the membrane 14 when the surface 4o is applied upon and contact with the surface 4o of the product substrate 4 thus takes place, no longer directly, but via the membrane 14. In this way a similar, but due to the continuity of the membrane 13 more continuous and thus more uniformly distributed compressive application is achieved.

Figure 7:
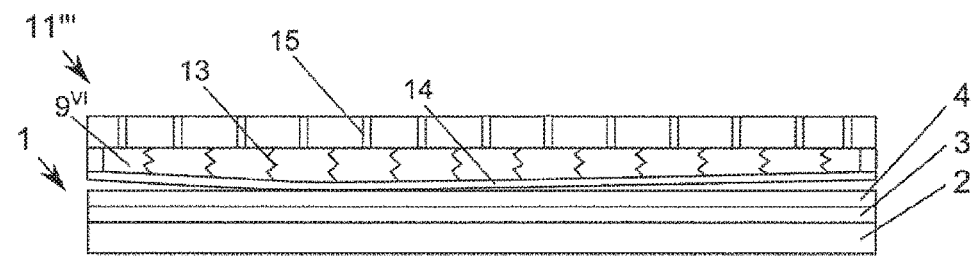
FIG. 7 shows a schematic cross section of a surface application apparatus according to a third embodiment.

According to another embodiment which is shown in FIG. 7, there is an application apparatus 11'" which has application units $9^{VI}$ in the form of pressure chambers. The pressure chambers are bordered by elastic pressure chamber walls 13 and the membrane 14. The pressure chambers can be controlled individually by their being exposed to pressure. The pressure is applied by a fluid which is routed via fluid accesses 15 into or out of the pressure chamber. The fluid can be a gas, a gas mixture, a liquid, a liquid mixture or in certain applications a gas-liquid mixture.

The membrane 14, in addition to its function as a pressure transfer element, can have heating elements which are triggered in particular with local resolution, for heating of the substrate stack 1, especially of the interconnect layer 3.

Figure 8:
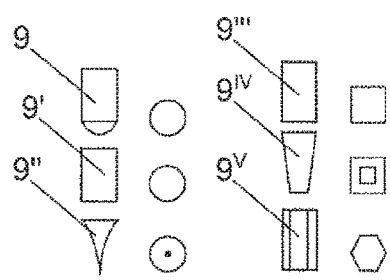
FIG. 8 shows a schematic of a cross section (at left) and of a bottom view (at right) of six embodiments of an application head.

FIG. 8 shows different alternative forms for the application units 9, 9', 9", 9'", $9^{IV}$, $9^V$, $9^{VI}$. Jacket surfaces of the application units 9, 9', 9", 9'", $9^{IV}$, $9^V$, $9^{VI}$ are preferably shaped as round, in particular circular (three versions 9, 9', 9" at left) or square cylinders (three versions 9'", $9^{IV}$, $9^V$ at right).

The application side (or application head) is in particular rounded (application unit 9), flat (application units 9', 9'"), pointed (application unit 9"), conically flattened (application unit $9^{IV}$) or hexagonally flat (application unit $9^V$).

Figure 9:
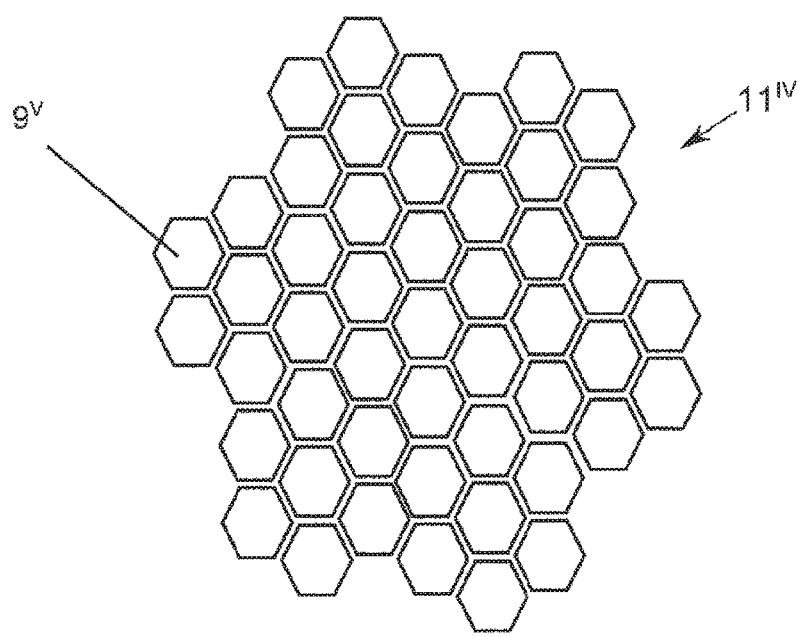
FIG. 9 shows a schematic bottom view of a fourth embodiment of a surface application apparatus with a field of hexagonal flat application heads.

FIG. 9 shows one embodiment of an application apparatus $11^{IV}$ which is made as a surface application apparatus with a field of hexagonal flat application units $9^V$. The application units $9^V$ adjoin one another in a honeycomb fashion and are therefore outstandingly well suited for the method of the invention by division and stability.

REFERENCE NUMBER LIST 1 substrate stack
2 first substrate, in particular carrier substrate
3 interconnect layer, in particular temporary cement
4 second substrate, in particular product substrate
4o surface of the product substrate
5 measuring unit
6 mounting base
7 transmitter-receiver unit
8 wafer chuck
9, 9', 9" application units
9'", $9^{IV}$ application units
$9^V$, $9^{VI}$ application units
9k application head
10, 10', 10" braces, brace bodies
11, 11', 11" application apparatus
11'", $11^{IV}$ application apparatus
12 convex bow, thickness peak
13 pressure chamber wall
14 membrane
15 fluid access
dz deformation path
t substrate stack thickness
$t_{si}$ ideal substrate stack thickness
$t_{sr}$ real substrate stack thickness
$t_t$ carrier substrate thickness
$t_p$ product substrate thickness

The invention claimed is:

1. A method for equalizing thickness variation of a wafer stack in a post-bond process, the method comprising:
   providing a wafer stack comprised of a product wafer and a carrier wafer connected by means of an interconnect layer, said wafer stack having one or more local thickness peaks;
   measuring a local thickness of the wafer stack at a plurality of different X-Y positions of the wafer stack to determine X-Y positions of the one or more local thickness peaks;
   applying a local mechanical pressure to a surface of the product wafer at the X-Y positions of the one or more local thickness peaks of the wafer stack by means of an application apparatus having at least one application unit; and
   equalizing the one or more local thickness peaks in a controlled manner without removal of any material from the product or carrier wafers by applying the local mechanical pressure to the surface of the product wafer at the X-Y positions of the one or more local thickness peaks, said product wafer disposed to local deformations due to application of the local mechanical pressure by the at least one application unit.

2. The method as claimed in claim 1, wherein the interconnect layer is deformed when applying the local mechanical pressure.

3. The method as claimed in claim 1, wherein the application apparatus applies the local mechanical pressure exclusively to the surface of the product wafer at the X-Y positions of the one or more local thickness peaks.

4. The method as claimed in claim 1, wherein the X-Y positions of the one or more local thickness peaks are determined prior to applying the local mechanical pressure to the surface of the product wafer at the X-Y positions of the one or more local thickness peaks.

5. The method as claimed in claim 4, wherein the local thickness of the wafer stack is measured using an optical measuring unit.

6. The method as claimed in claim 4, wherein the local thickness of the wafer stack is measured using an acoustic measuring unit.

7. The method as claimed in claim 1, wherein the application apparatus has a plurality of said application units.

8. The method as claimed in claim 7, wherein the method includes triggering the plurality of application units separately to apply the local mechanical pressure to the surface of the product wafer.

9. The method as claimed in claim 7, wherein the plurality of application units are arranged discretely.

10. The method as claimed in claim 7, wherein the application apparatus simultaneously applies the local mechanical pressure to the surface of the product wafer at a plurality of the X-Y positions.

11. The method as claimed in claim 1, wherein the application apparatus has a membrane that covers the at least one application unit.

12. The method as claimed in claim 1, wherein the step of applying the local mechanical pressure to the surface of the product wafer at the X-Y positions of the one or more local thickness peaks reduces the thickness variation in the wafer stack by at least half.

13. A device for equalizing thickness variation of a wafer stack in a post-bond process, the device comprising:
a wafer chuck for accommodating a wafer stack comprised of a product wafer and a carrier wafer connected by means of an interconnect layer, said wafer stack having one or more local thickness peaks;
a measuring device for measuring a local thickness of the wafer stack at a plurality of different X-Y positions of the wafer stack to determine X-Y-positions of the one or more local thickness peaks; and
an application apparatus having at least one application unit for applying a local mechanical pressure to a surface of the product wafer at the X-Y positions of the one or more local thickness peaks of the wafer stack, said application apparatus equalizing the one or more local thickness peaks without removal of any material from the product or carrier wafers by applying the local mechanical pressure to the surface of the product wafer at the X-Y positions of the one or more local thickness peaks,
wherein the at least one application unit (i) equalizes the one or more local thickness peaks in a controlled manner, and (ii) disposes the product wafer to local deformations by applying the local mechanical pressure.

14. The device as claimed in claim 13, wherein the measuring device includes an optically and/or an acoustically operating measuring unit for determining the X-Y positions of the one or more local thickness peaks.

15. The device as claimed in claim 13, wherein the application apparatus includes a plurality of said application units.

16. The device as claimed in claim 15, wherein the plurality of said application units are triggered separately to apply the local mechanical pressure to the surface of the product wafer.

17. The device as claimed in claim 15, wherein the plurality of said application units are arranged discretely.

18. The device as claimed in claim 15, wherein the application apparatus simultaneously applies the local mechanical pressure to the surface of the product wafer at a plurality of the X-Y positions.

19. The device as claimed in claim 13, wherein the application apparatus includes a membrane that covers the at least one application unit.

* * * * *